United States Patent [19]

Ishihara et al.

[11] Patent Number: 4,885,258

[45] Date of Patent: Dec. 5, 1989

[54] METHOD FOR MAKING A THIN FILM TRANSISTOR USING A CONCENTRIC INLET FEEDING SYSTEM

[75] Inventors: Shunichi Ishihara, Kanagawa; Hirokazu Ootoshi, Tokyo; Masaaki Hirooka, Ibaragi; Junichi Hanna, Kanagawa; Isamu Shimizu, Kanagawa, all of Japan

[73] Assignee: Canon Kabushiki Kaisha, Tokyo, Japan

[21] Appl. No.: 267,701

[22] Filed: Nov. 1, 1988

Related U.S. Application Data

[60] Division of Ser. No. 163,200, Feb. 26, 1988, abandoned, which is a continuation of Ser. No. 945,573, Dec. 23, 1986, abandoned.

[30] Foreign Application Priority Data

Dec. 26, 1985 [JP] Japan ................... 60-292312

[51] Int. Cl.$^4$ .............. H01L 21/265; H01L 21/20
[52] U.S. Cl. ..................... 437/40; 148/DIG. 1; 148/DIG. 57; 148/DIG.169; 357/6; 357/23.7; 437/62; 437/101; 437/914
[58] Field of Search ..................... 148/DIG. 1,48,57,71,169; 427/53.1, 55; 437/2-4, 61, 62, 101, 173, 40, 41, 914, 942, 963; 357/4, 6, 23.7

[56] References Cited

U.S. PATENT DOCUMENTS

| Re. 31,708 | 10/1984 | Gordon | 427/126.2 |
|---|---|---|---|
| 2,552,626 | 5/1951 | Fisher et al. | 201/64 |
| 3,083,550 | 4/1963 | Auerbach | 65/3 |
| 3,188,230 | 6/1965 | Bakish et al. | 117/107.1 |
| 3,203,827 | 8/1965 | Hill | 117/107.2 |
| 3,218,204 | 11/1965 | Ruehrwein | 148/175 |
| 3,224,912 | 12/1965 | Ruehrwein | 148/175 |
| 3,306,768 | 2/1967 | Peterson | 117/106 |
| 3,466,191 | 9/1969 | Stinchfield et al. | 117/213 |
| 3,506,556 | 4/1970 | Gillery et al. | 204/192 |
| 3,655,429 | 4/1972 | Deklerk | 117/106 |
| 3,664,866 | 5/1972 | Manasevit | 117/201 |
| 3,850,679 | 11/1974 | Sopko et al. | 117/106 R |
| 3,870,558 | 3/1975 | Shimizu et al. | 117/201 |
| 3,922,703 | 11/1975 | Pankove | 357/23.7 |
| 4,058,430 | 11/1977 | Suntola et al. | 156/611 |
| 4,096,822 | 6/1978 | Yamawaki et al. | 118/48 |
| 4,146,657 | 3/1979 | Gordon | 427/126 |
| 4,180,596 | 12/1979 | Crowder et al. | 427/42 |
| 4,206,252 | 6/1980 | Gordon | 427/160 |
| 4,282,267 | 8/1981 | Kuyel | 427/91 |
| 4,328,261 | 5/1982 | Heinecke et al. | 427/91 |
| 4,359,490 | 11/1982 | Lehrer | 427/95 |
| 4,416,217 | 11/1983 | Nakamura et al. | 118/696 |
| 4,422,407 | 12/1983 | Bessot et al. | 118/723 |
| 4,425,572 | 1/1984 | Takafugi et al. | 357/23.7 |
| 4,502,204 | 3/1985 | Togashi et al. | 357/23.7 |

(List continued on next page.)

FOREIGN PATENT DOCUMENTS

| 0232619 | 8/1987 | European Pat. Off. | 437/101 |
|---|---|---|---|
| 0190058 | 11/1983 | Japan | 437/101 |
| 0019378 | 1/1984 | Japan | 437/101 |
| 0163318 | 7/1987 | Japan | 437/101 |

Primary Examiner—Brian E. Hearn
Assistant Examiner—William D. Bunch
Attorney, Agent, or Firm—Fitzpatrick, Cella, Harper & Scinto

[57] ABSTRACT

There is provided an improved thin-film transistor of which a principal semiconducting layer comprises a layer composed of an amorphous material prepared by (a) introducing (i) a gaseous substance containing atoms capable of becoming constituents for said layer into a film forming chamber having a substrate for thin-film transistor through a transporting conduit for the gaseous substance and (ii) a gaseous halogen series substance having a property to oxidize the gaseous substance into the film forming chamber through a transporting conduit for the gaseous halogen series oxidizing agent, (b) chemically reacting the gaseous substance and the gaseous halogen series agent in the film forming chamber in the absence of a plasma to generate plural kinds of precursors containing exited precursors and (c) forming said layer on the substrate with utilizing at least one kind of those precursors as a supplier.

10 Claims, 2 Drawing Sheets

U.S. PATENT DOCUMENTS

| | | | |
|---|---|---|---|
| 4,515,107 | 5/1985 | Fournier et al. | 118/718 |
| 4,526,809 | 7/1985 | Hall et al. | 427/74 |
| 4,529,679 | 7/1985 | Ogawa et al. | 430/84 |
| 4,595,601 | 6/1986 | Horioka et al. | 427/53.1 |
| 4,618,873 | 10/1986 | Sasano et al. | 357/23.7 |
| 4,650,539 | 3/1987 | Irvine et al. | 156/613 |
| 4,668,969 | 5/1987 | Yamazaki | 357/23.7 |
| 4,683,146 | 7/1987 | Hirai et al. | 427/54.1 |
| 4,686,553 | 8/1987 | Possin | 357/23.7 |
| 4,751,192 | 6/1988 | Hirooka et al. | 437/4 |
| 4,771,015 | 9/1988 | Kanai et al. | 437/109 |
| 4,772,570 | 9/1988 | Kanai et al. | 437/109 |
| 4,798,809 | 1/1989 | Hirooka et al. | 437/4 |

METHOD FOR MAKING A THIN FILM TRANSISTOR USING A CONCENTRIC INLET FEEDING SYSTEM

This application is a division of application Ser. No. 163,200 filed Feb. 26, 1988, which, in turn, is a continuation of application Ser. No. 945,573, filed Dec. 23, 1986, both now abandoned.

FIELD OF THE INVENTION

This invention relates to an improved thin-film transistor. More particularly, it relates to an improved thin-film transistor of which at least one of the principal semiconducting layers comprises a layer composed of an amorphous material prepared through a chemical reaction of a specific gaseous substance with a gaseous halogen series substance in the absence of a plasma.

BACKGROUND OF THE INVENTION

For the preparation of an amorphous or polycrystalline functional film such as semiconducting film, insulative film, photoconductive film, magnetic film or metallic film for use in thin-film transistor (TFT) or the like, there have been proposed a number of methods suited for the respective films from the viewpoints of expected physical characteristics thereon and their uses.

For instance, for the preparation of a deposited silicon-containing film, namely, a non-monocrystalline silicon film of which unpaired electrons are compensated with a compensating agent such as hydrogen atom (H) or halogen atom (X) [hereinafter referred to as "NON-Si(H,X)"] such as an amorphous silicon film of which unpaired electrons are compensated with said compensating agent [hereinafter referred to as "a-Si(H,X)"] or polycrystalline silicon film of which unpaired electrons are compensated with said compensating agent [hereinafter referred to as "poly-Si(H,X)"], wherein the so-called crystallite silicon film lies in the range of the aforesaid a-Si(H,X) as a matter of course, there have been proposed various methods using vacuum evaporation technique, heat chemical vapor deposition technique, plasma chemical vapor deposition technique, reactive sputtering technique, ion plating technique and light chemical vapor deposition technique.

Among those methods, the method using plasma vapor deposition technique (hereinafter referred to as "plasma CVD method") has been generally recognized as being the most preferred and is currently used on a commercial basis.

However, the operation conditions to be employed under the plasma CVD method are much more complicated than the known CVD method, and it is extremely difficult to generalize them.

That is, there already exist a number of variations even in the correlated parameters concerning the temperature of a substrate, the amount and the flow rate of gases to be introduced, the degree of pressure and the high frequency power for forming a film, the structure of an electrode, the structure of a reaction chamber, the flow rate of exhaust gases and the plasma generation system. Besides said parameters, there also exist other kinds of parameters. Under these circumstances, in order to obtain a desirable deposited film product it is required to choose precise parameters from a great number of varied parameters. Sometimes, serious problems occur. Because of the precisely chosen parameters, a plasma is apt to be in an unstable state. This condition often invites problems in a deposited film to be formed.

In addition, since a plasma is directly generated by the action of a high-frequency wave or a microwave in a film forming space wherein a substrate is placed, electrons or ion species resulted therein sometimes come to damage a film to be deposited on the substrate. In that case, the resulting film product eventually becomes such that has an undesired quality unevenness and quality deterioration.

And for the apparatus in which the process using the plasma CVD method is practiced, its structure will eventually become complicated since the parameters to be employed are precisely chosen as stated above.

Whenever the scale or the kind of the apparatus to be used is modified or changed, the apparatus must be so structured as to cope with the precisely chosen parameters.

In this regard, even if a desirable deposited film should be fortuitously mass-produced, the film product becomes unavoidably costly because (1) a heavy investment is firstly necessitated to set up a particularly appropriate apparatus therefor; (2) a number of process operation parameters even for such apparatus still exist and the relevant parameters for the mass-production of such film. In accordance with such precisely chosen parameters, the process must then be carefully practiced.

As a solution to solve those problems as mentioned above, the so-called indirect plasma CVD method has been proposed.

The indirect plasma CVD method comprises generating plasmas in an upper stream space apart from a film forming space with microwave energy or the like and transporting the plasmas in the film forming space having a substrate so that chemical species are selectively utilized to form a deposited film on the substrate.

However, in this indirect plasma CVD method, as a plasma is generated not in the film forming space but in a different space apart therefrom and the plasma is then transported in the film forming space, the life span of the chemical species must be long enough to form a deposited film. In this connection, for this indirect plasma CVD method, there exist problems. That is, firstly, only a limited kind of a deposited film can be obtained because the kind of a starting gas to be employed is limited to such that gives a chemical species of a long life span. Secondly, a large quantity of energy is necessitated for the generation of plasmas in the aforesaid space. Thirdly, the generation of a chemical species capable of contributing in forming a deposited film and which has a sufficiently long enough life span can not be easily attained. Finally, it is difficult to maintain the original amount of such chemical species until the formation of a deposited film.

Besides this indirect plasma CVD method, there has been attempted to use a method using light chemical vapor deposition technique (hereinafter referred to as "light CVD method").

For the light CVD method, although there is an advantage that neither such electron nor such ion species as giving a damage to a film to be deposited on a substrate does not occur, there exist problems.

That is, firstly, only a limited number of light sources can be practically used. Secondly, even for such light source, its wavelength has a partiality toward the ultraviolet side, therefore a large scale light source and a particular power source are necessitated.

Thirdly, since the inner surface of a light transmission window gradually becomes coated with a film following the proceeding of the film forming process, the quantity of light to be incidented through the transmission window into a film forming space eventually becomes decreased to thereby retard the film deposition on the substrate.

Against this background, there is now an increased demand for a method that makes it possible to practice the process at a high film-forming rate in a simple procedure in order to mass-produce a desirable semiconducting film for thin-film transistor having a relevant uniformity and having many practically applicable characteristics and such that the product will be relatively inexpensive.

Likewise, there is a similar situation which exists with respect to other kinds of semiconducting films for thin-film transistor, such as silicon:nitrogen film, silicon:carbon film and silicon:oxygen film.

SUMMARY OF THE INVENTION

The present inventors have conducted extensive studies in order to solve the problems in the aforementioned known methods and in order to develop a new process for effectively and simply preparing a desirable functional deposited film usable as a principal semiconducting layer for thin-film transistor, for instance, an amorphous silicon film which has a wealth of practically applicable characteristics, without depending upon any known method and which meets the above-mentioned demands.

As a result, the present inventors finally found a process that enables one to efficiently and stably said film in simplified particular procedures as detailed below.

It is therefore an object of this invention to provide an improved thin-film transistor of which at least one of the principal semiconducting layers comprises a high quality functional film having a wealth of practically applicable electrical, optical and semiconductive characteristics, which is composed of an amorphous material and which is prepared by chemically reacting (i) a substance which contributes in forming said film and (ii) a halogen series substance which reacts with said substance (i) in the absence of a plasma.

Another object of this invention is to provide a process for preparing the above film using a gaseous substance which contributes in forming the above film and a gaseous halogen series substance which can oxidize said gaseous substance, in the absence of a plasma, to form the above film on a substrate in a film forming space of a closed system at a high film-forming rate.

DESCRIPTION OF THE PREFERRED EMBODIMENTS

Figure 1:
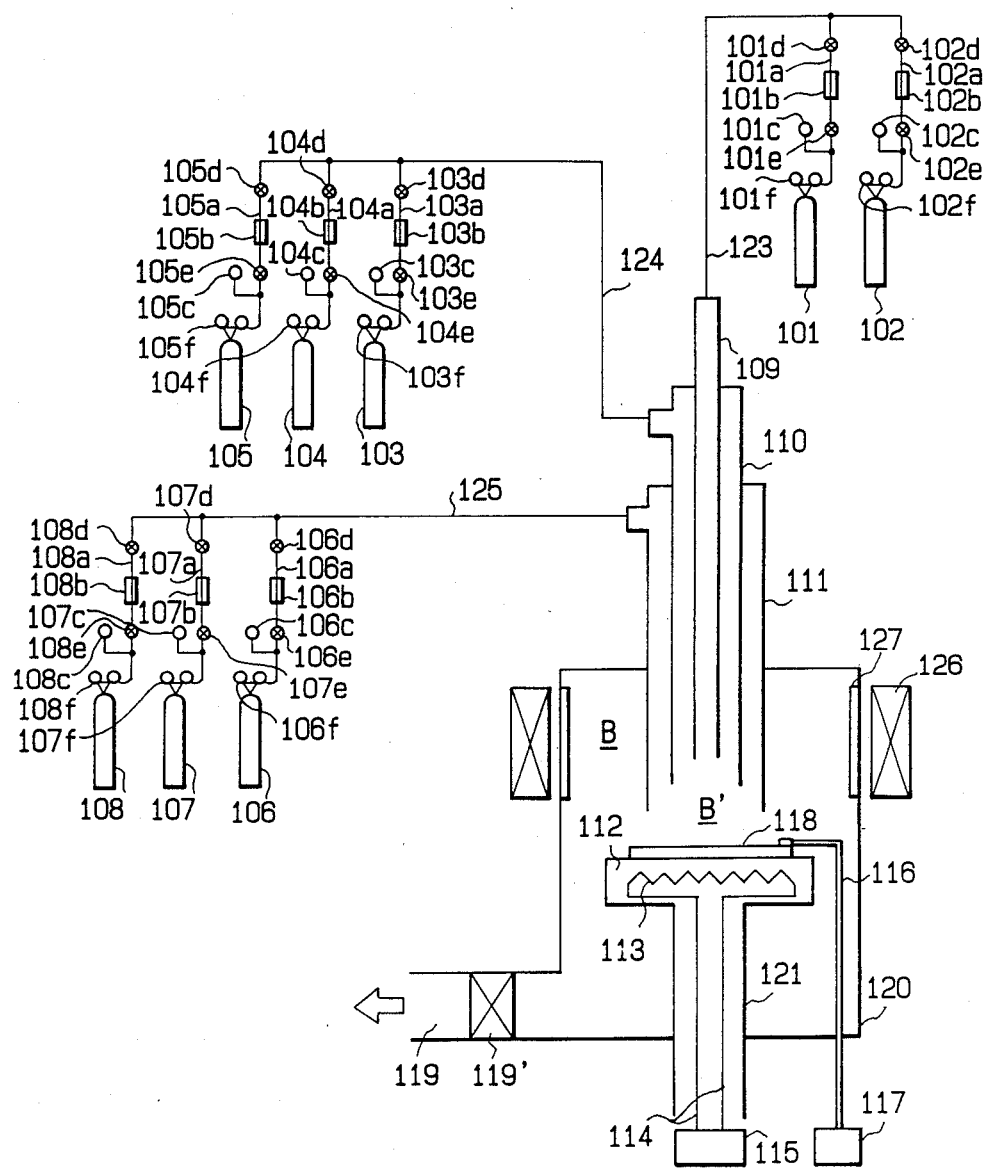
FIG. 1 is a schematic explanatory view of a representative fabrication apparatus for preparing a thin-film transistor according to this invention.

The objects of this invention as described above are attained by practicing a process which comprises; selecting (i) a substance which can be a constituent for a semiconducting layer to be formed but which does not or can hardly contribute in forming the foregoing layer as long as it remains in its original energy state (hereinafter referred to as "substance A") and (ii) a halogen series substance which can react with the substance A to oxidize it (hereinafter referred to as "oxidizing agent"); introducing the two substances in gaseous state into a film forming chamber wherein a substrate is placed while being meintained at a predetermined temperature separately through respective transporting conduits; chemically reacting the two substances in the absence of a plasma to generate plural kinds of precursors containing excited precursors; and forming said layer on the substrate with utilizing at least one kind of those precursors as a supplier.

According to this invention, there are provided the following advantages: a desirable semiconducting layer for a thin-film transistor which has a uniform thickness and a desirable homogeneity may be effectively formed at an improved film forming rate in simple procedures without consumption of so much energy as in any of the conventional methods; the operation parameters for preparing a semiconducting layer for a thin-film transistor may be largely simplified; an improved thin-film transistor having such desirable semiconducting layer or if necessary, of a large square measure may be mass-produced on an industrial scale to thereby reduce the cost of a product; and such a heavy investment as much for the apparatus in the conventional plasma CVD method is not necessitated even if the case of setting up a particularly appropriate apparatus to practice the process of this invention.

The starting substance to be used as the foregoing substance A which contributes in forming a semiconducting layer for the thin-film transistor of this invention means a substance which can be a constituent for said layer but which does not or hardly contribute in forming said layer as long as it remains in its original energy state, as previously mentioned. But it is required for the substance A to generate plural kinds of precursors containing excited precursors when it is reacted with the foregoing halogen series oxidizing agent.

And the substance A is selected appropriately in accordance with the kind, the expecting characteristics to be brought about, and/or the using purpose of the objective semiconducting layer.

For the substance A, any gaseous, liquid or solid substance may be used as long as it meets the above condition, and it can be easily in gaseous state when chemically reacted with said oxidizing agent.

When a liquid or solid substance is employed as the substance A, it is bubbled using an inert gas such as Ar, He, $N_2$ or $H_2$ and, if necessary, while being heated to thereby cause generating a gas of the substance, which is then introduced into a film forming chamber.

Usable as the substance A, for example, in the case of forming a semiconducting and/or insulative film such as tetrahedral deposited film e.g. silicon-containing deposited film or germanium-containing film, are straight chain silane compounds, branched chain silane compounds, cyclic silane compounds and chain germanium-containing compounds.

Specific examples are $Si_nH_{2n+2}$ (n=1, 2, 3, 4, 5, 6, 7 or 8) for the straight chain silane compound; $SiH_3SiH(SiH_3)SiH_2SiH_3$ for the branched silane compound; and $Ge_mH_{2m+2}$ (m=1, 2, 3, 4 or 5) for the chain germanium-containing compound.

Other than these compounds, there can be raised tin-containing compounds such as tin halide e.g. $SnH_4$ as the substance A in the case of forming a tin-containing deposited functional film.

For the foregoing halogen series oxidizing agent, a gaseous substance is used. There are also requirements for the oxidizing agent. That is, the oxidizing agent must be such that has a property to easily cause an excitation for the substance A due to the electronical oxidation action of the oxidizing agent at the time of a chemical contact between the two substances. Therefore, usable as such oxidizing agent are, for example, halogen gases such as $F_2$, $Cl_2$, $Br_2$ and $I_2$, and others than these, nascent state halogens such as nascent state fluorine, chlorine and iodine.

The aforementioned substance A and the aforementioned halogen series oxidizing agent are introduced separately through respective transporting conduits into a film forming chamber with an appropriate flow rate and under an appropriate pressure condition and collided each other to cause chemical reaction between the two substances to thereby invite generation of plural kinds of precursors containing excited precursors. And at least one kind of those resulting precursors is directed as a supplier to form a deposited film to be a semiconducting layer on a substrate placed while being maintained at a predetermined temperatue in the film forming chamber.

In the above film forming process, the excited precursor generated therein becomes other kind precursor or other kind excited precursor through successive decomposition or chemical reaction, or it sometimes liberates an energy. However the excited precursor comes to the result to touch the surface of the substrate placed while being maintained at a predetermined temperature in the film forming space and bring about the formation of a deposited film having a three dimensional network structure on the substrate. In this system, the energy level of the excited precursor generated as a result of the contact between the substance A and the oxidizing agent is preferred to be either such that is transited to a lower energy level or such that is accompanied with an emission during the process when the excited precursor be changed into other kind chemical species. Because of the generation of plural kinds of precursors containing such excited precursor as being accompanied with an emission for its energy transition, the formation process of the semiconducting layer is effectively proceeded with a lower consumption of power energy to thereby result in obtaining an improved thin-film transistor provided with a desirable semiconducting layer having a uniform thickness and a desirable homogeneity and having excellent semiconductive characteristics.

The combination of the substance A and the oxidizing agent is appropriately selected according to the kind of a semiconducting film to be formed on the substrate.

The electrical conductivity and/or the electrical conduction type of the semiconducting layer to be formed can be controlled by incorporating either an element of Group IIIA of the Periodic Table (hereinafter referred to as "group IIIA atom") or an element of Group VA of the Periodic Table (hereinafter referred to as "group VA atom") in the semiconducting film.

The incorporation of the group IIIA atom or the group VA atom in the semiconducting layer is carried out by doping the film with relevant such atoms during its formation process.

As the group IIIA atoms, there are B, Al, Ga, In and Tl. As the group VA atoms, there are N, P, As, Sb and Bi. Among these atoms, B, Ga, P and Sb are most preferred.

For the starting substance to impart such atoms, either a gaseous substance or gasifiable substance containing such atoms as the constituents are employed.

Specific examples are $PH_3$, $P_2H_5$, $PCl_3$, $AsH_3$, $AsCl_3$, $SbH_3$, $BiH_3$, $BCl_3$, $BBr_3$, $B_2H_6$, $B_4H_{10}$, $B_5H_9$, $B_5H_{11}$, $B_6H_{10}$, $B_6H_{12}$ and $AlCl_3$.

And, the starting substance to impart nitrogen atoms (N) can include nitrogen ($N_2$), nitrogen monoxide (NO), ammonia ($NH_3$), hydrazine ($H_2NNH_2$), hydrogen azie ($HN_3$) and ammonium azie ($NH_4N_3$).

Other than these compounds, compounds comprising C and H as the constituents such as saturated hydrocarbons of 1 to 4 carbon atoms, ethylenic hydrocarbons of 2 to 4 carbon atoms and acetylenic hydrocarbons of 2 to 3 carbon atoms can be used in case where necessary.

Specifically, the saturated hydrocarbons can include methane ($CH_4$), ethane ($C_2H_6$), propane ($C_3H_8$), n-butane (n-$C_4H_{10}$) and pentane ($C_5H_{12}$), the ethylenic hydrocarbons can include ethylene ($C_2H_4$), propylene ($C_3H_6$), butene-1 ($C_4H_8$), butene-2 ($C_4H_8$), isobutylene ($C_4H_8$) and pentene ($C_5H_{10}$) and the acetylenic hydrocarbons can include acetylene ($C_2H_2$), methylacetylene ($C_3H_4$) and butine ($C_4H_6$).

As for the substrate, it may be either electroconductive or electrically insulative. The shape of the substrate may be optionally determined. Examples of the shape are drum, belt, plate and the like.

The thickness of the substrate is optional. But it is usually not less than 10 microns in the view points of the fabrication and handling or mechanical strength of the substrate.

Examples of the electroconductive substrate are, metals such as Al, Cr, Mo, Au, Ir, Nb, Ta, V, Ti, Pt, Pd and the like, or alloys such as NiCr, stainless steel or alloys of said metals.

Examples of the electrically insulating substrate are films or sheets of synthetic resin such as polyester, polyethylene, polycarbonate, cellulose acetate, polypropylene, polyvinyl chloride, polyvinylidene chloride, polystyrene, polyamide and the like, other than these, glass or ceramics. For the electrically insulating substrate, it is desirable that at least one surface thereof is conductivized and a relevant layer is formed on the conductivized surface of the substrate.

For example, in case of glass, its surface may be conductivized by fixing a thin layer of a metal such as NiCr, Al, Cr, Mo, Au, Ir, Nb, Ta, V, Ti, Pt, Pd, $In_2O_3$, $SnO_2$, ITO ($In_2O_3+SnO_2$) etc. And in case of synthetic resin film such as polyester film etc., its surface may be conductivized with a metal such as NiCr, Al, Ag, Pd, Zn, Ni, Au, Cr, Mo, Ir, Nb, Ta, V, Ti, Pt, etc. In accordance with vacuum vapor deposition technique, electron beam vapor deposition technique or sputtering technique. In another way, its surface may be also conductivized by laminating it with on of said metals.

As for the substrate to be used, an appropriate one is selected from those as mentioned above considering its adhesiveness and reactivity with the film to be formed thereon.

Further, since there will sometimes occur such a case that a desirable semiconductive layer can not be obtained when there exists such a larger difference of thermal expansion between a substrate and a semiconducting layer to be formed as to bring about a strain in the layer, it is preferred to use such a substrate as having a close thermal expansion coefficient to a semiconducting layer to be formed thereon.

It is a matter of course that the surface of a substrate is so designed not to invite any problem for the structure and texture of a semiconducting layer to be formed thereon because of the surface state of the substrate.

In the process for preparing an improved thin-film transistor according to this invention, the conditions upon forming the corresponding semiconducting layer, for example, the combination of the substance A with the oxidizing agent, their mixing ratio, the gas pressure upon mixing those substances in the film forming chamber, their gas flow rates, the internal pressure upon forming the layer on the substrate, the carrier gas flow rate, the temperature of the substrate and the flow type of each gaseous substance when introduced into the film forming chamber are important factors for obtaining a desirable layer having desired characteristics, and they are appropriately selected while considering the functions of the layer to be formed. Further, since these layer forming conditions are organically correlated and may be varied depending upon the kind and the amount of each of the atoms contained in the layer, the conditions are to be determined taking these relationships into consideration.

The volume ratio of the substance A to the oxidizing agent on the basis of the flow ratio is preferably 1/20 to 100/1, and more preferably, 1/5 to 50/1.

The gas pressure in the film forming chamber when the substance A is mixed with the oxidizing agent is preferred to be higher in order to facilitate their chemical reaction. But it is necessary to be determined with due regard to their reactivities. Therefore, it is preferably $1 \times 10^{-7}$ to 10 atmospheric pressure, and more preferably, $1 \times 10^{-6}$ to 3 atmospheric pressure.

The internal pressure in the film forming chamber, namely, the pressure of the inner space wherein the substrate is placed is appropriately determined with due regard to the excited precursors to be generated in the above inner space and to the conditions which let those precursors derived from the excited precursors to become effective in forming a deposited layer.

The internal pressure in the film forming chamber in the case where the reaction region is open-connected to the film forming region can be adjusted with the use of a differential exhausting means or a large scale exhausting device while having due regard to the correlated conditions relating to the introducing pressure and the introducing flow rate for each of the gaseous substance A and the gaseous oxidizing agent when they are introduced into the reaction region of the film forming chamber.

In the case where the conductance of the connecting part between the reaction region and the film forming region is relatively small, the internal pressure in the film forming region can be adjusted by controlling the amount of the exhaust gas by operating an exhaust device being connected to the film forming region.

Further in the case where the reaction region and the film forming region are united and they are not structurally separated, it is desirable to conduct the gas exhaustion with a differential gas exhausting means or with the use of a large scale gas exhausting device.

As above mentioned, the internal pressure in the film forming chamber is determined while having a due regard on the correlative pressure conditions in introducing the gaseous substance A and the gaseous oxidizing agent into the film forming chamber.

However, in general, the internal pressure is preferably 0.001 to 100 Torr, more preferably, 0.01 to 30 Torr, and most preferably, 0.05 to 10 Torr.

As for the form of the gas flow into the film forming space for each of the foregoing substances, they are appropriately designed with due regard to the geometrical arrangement of the gas flow inlet, the substrate and the gas flow outlet so that the gaseous substance A and the gaseous oxidizing agent are effectively introduced into and homogeneously and well mixed in the predetermined region of the film forming chamber to generate desired precursors and to bring about the effective formation of a deposited film on the substrate.

The temperature of the substrate upon forming a deposited film thereon is properly determined according to the kind of a gaseous substance to be employed and also to the kind of a deposited film to be formed.

That is, in the case of forming a deposited film composed of an amorphous material, the temperature is preferably room temperature to 450° C., and more preferably, 50° to 400° C.

In particular, in the case of forming a deposited film having a wealth of excellent semiconductive characteristics and photoconductive characteristics, it is most preferably 70° to 350° C.

Further, in the case of forming a deposited polycrystalline amorphous film, it is preferably 200° to 650° C., and more preferably, 300° to 600° C.

The atmospheric temperature in the film forming space is properly determined with due regard to the temperature of the substrate so that desired precursors are effectively generated, and those precursors as generated and other precursors derived from the former precursors are not changed into undesired things during the film forming process in the film forming chamber.

The advantages of this invention are now described in more detail by reference to the following Examples 1 to 4, which are provided here for illustrative purposes only, and are not intended to limit the scope of this invention.

In each of the examples, the corresponding layer of the thin-film transistor according to this invention is formed by using the fabrication apparatus as shown in FIG. 1.

The fabrication apparatus as shown in FIG. 1 comprises a reaction chamber having a film forming space with which a gas supplying system and a gas exhausting system are provided.

In FIG. 1, there are shown gas reservoirs 101 through 108, gas supplying pipe ways 101a through 108a respectively extended from the gas reservoirs 101 through 108, mass flow controllers 101b through 108b being placed respectively on the gas supplying pipe ways 101a through 108a for controlling the flow rate of a gas from each of the gas reservoirs, pressure gages 101c through 108c, main valves 101d through 108d, sub-valves 101e through 108e and gas reservoir pressure gases 101f through 108f.

With reaction chamber 120, there are provided first gas supplying conduit 109, second gas supplying conduit 110 and third gas supplying conduit 111 which are extended into a film forming space B of the reaction chamber through its upper wall and ended leaving a space B sufficient enough to form a reaction region between a substrate 118 to be placed therein.

The first, second and third gas supplying conduits 109, 110 and 111, respectively, are used as a concentric triple conduit having a first circular space as the first gas supplying conduit 109, a second circular space as the second gas supplying conduit 110 and a cylindrical space positioned in the middle as the third gas supplying conduit 111.

And the end portion of the concentric triple conduit in the film forming space B is desired to be in such a form as showing an inwardly cut surface at an external appearance with leaving a round space B' to act as the reaction region. And with the inwardly cut surface the outlet of each of the gas supplying conduits 109, 110 and 111 is downwardly opened.

In an alternative, the end portion of the concentric triple conduit may be structured in such a way that the outlet of the third gas supplying conduit 111 in the cylindrical form is positioned in the innermost recess and the remaining end portion composed of the outlets of the first and second gas supplying conduits is in the diagonally cut surface form so as to leave a space in the form of conic trapezoid B' to act as the reaction region.

A gas feeding pipe 123 for the gas from the gas reservoirs 101 and 102 is connected to the first gas supplying conduit 109; a gas feeding pipe 124 for the gas from the gas reservoirs 103, 104 and 105 is connected to the second gas supplying conduit 110; and a gas feeding pipe 125 for the gas from the gas reservoirs 106, 107 and 108 is connected to the third gas supplying conduit 111.

Exhaust pipe 119 is provided at the bottom part of the reaction chamber 110 having a vacuum valve 219'. The exhaust pipe 119 is connected to an exhausting device (not shown).

The air or gas in the gas feeding pipes 123, 124 and 125, the gas supplying conduits 109, 110 and 111 and the reaction chamber 120 can be evacuated by operating the exhausting device through the exhaust pipe 119.

The substrate 118 is placed on substrate holder 112 which can be shifted upwardly or downwardly with a driving means (not shown), and in which a heater 113 for the substrate is installed.

The heater 113 is electrically connected to an electric power source 115 through leading wires 114. A thermocouple 116, to measure the temperature of the substrate 118, is electrically connected to a temperature indicator 117 within the reaction chamber 120.

The position of the substrate 118 upon forming a deposited film thereon is appropriately adjusted by shifting the substrate holder 112 so that there is left a desired distance between the surface of the substrate 118 and the outlets of the gas supplying conduits 109, 110 and 111.

Such desired distance is determined properly depending upon the kind of a deposited film to be formed, its characteristics as expected, the flow rate of a gas to be employed, the internal pressure in the vacuum chamber and the like.

However, in general, it is preferably several millimeters to 20 cm, and more preferably 5 mm to 15 cm.

The heater 113 is operated usually to heat the substrate 118 to an appropriate temperature or to conduct a provisional heat treatment on the substrate. However, the heater 113 can be used to anneal the deposited film formed on the substrate.

EXAMPLE 1

Figure 2:
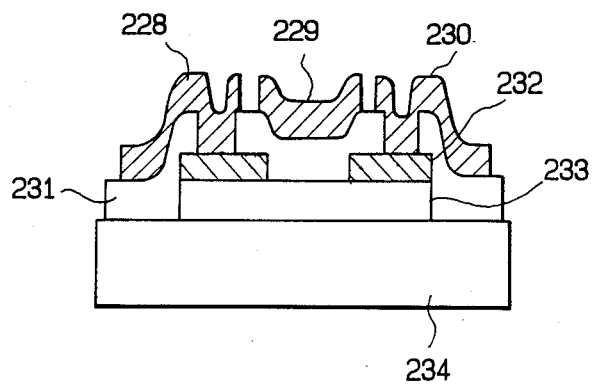
FIG. 2 is a cross-sectional portion view of a representative thin-film transistor according to this invention.

A thin-film transistor of the structure as shown in FIG. 2 was prepared using the fabrication apparatus as shown in FIG. 1.

In FIG. 2, there are shown substrate 234, amorphous silicon layer (first layer) 233 of 7000 Å in thickness, amorphous silicon layer doped with P in a high concentration (second layer) 232 of 500 Å in thickness, silicon oxide layer (third layer) 231 of 1000 Å in thickness, aluminum gate electrode 229, source electrode 228 and drain electrode 230.

As the substrate 234, a 7059 glass plate, production of Corning Glass Works, was used.

Each of the first, second and third layers was prepared respectively under the conditions as shown in the following Table 1.

TABLE 1

| Constituting Layer | Starting Substances | Flow Rate (sccm) | Film-forming Pressure Condition (Torr) |
|---|---|---|---|
| | (Temperature of Substrate: 300° C.) | | |
| First Layer | $SiH_4$ | 20 | 0.7 |
| | $F_2$ | 15 | |
| | He | 150 | |
| Second Layer | $SiH_4$ | 15 | 0.3 |
| | $PH_3$/He (1000 ppm) | 2 | |
| | $F_2$ | 10 | |
| | He | 20 | |
| Third Layer | $SiH_4$ | 20 | 0.6 |
| | NO | 50 | |
| | $F_2$ | 15 | |
| | He | 100 | |

An on-off ration was examined on the resulting thin-film transistor in comparison with a conventional thin-film transistor.

As a result, it was found that the on-off ratio of the resulting thin-film transistor was superior by about 15% to that of the conventional thin-film transistor.

EXAMPLE 2

The same procedures as in Example 1 were repeated, except that $Si_2H_6$ was used in stead of $SiH_4$ in forming the first layer, to obtain a thin-film transistor.

As a result of the examination of an on-off ratio on the resulting thin-film transistor by the same procedures as in Example 1, it was found that the on-off ratio of the resulting thin-film transistor was superior by about 17% to that of a conventional thin film transistor.

EXAMPLE 3

The same procedures as in Example 1 were repeated, except that $C_2H_4$ was used in stead of NO in forming the third layer, to obtain a thin-film transistor.

As a result of the examination of an on-off ratio on the resulting thin-film transistor by the same procedures as in Example 1, it was found that the on-off ratio of the resulting thin-film transistor was superior by about 14% to that of a conventional thin-film transistor.

EXAMPLE 4

The same procedures as in Example 1 were repeated, except that $NH_3$ was used in stead of NO in forming the third layer, to obtain a thin-film transistor.

As a result of the examination of an on-off ratio on the resulting thin-film transistor, it was found that the on-off ratio of the resulting thin-film transistor was superior by about 13% to that of a conventional thin-film transistor.

What we claim is:

1. A process for forming an improved amorphous silicon thin-film transistor comprising an insulating substrate, a first layer formed from a film of non-doped amorphous silicon semiconductive material deposited on the surface of the substrate, a second layer formed from a film of n-type impurity doped amorphous silicon material, a third layer formed from a film of amorphous silicon insulating material, a gate electrode formed from a metallic thin film, a source electrode formed from a metallic thin film and a drain electrode formed from a metallic thin film, the gate electrode being separated from the first layer by the third layer, the second layer being situated between the first layer and the source electrode and between the first layer and the drain electrode, said process comprising the steps of:

(a) maintaining the substrate at an elevated temperature in an evacuated film-forming space;

(b) introducing a gaseous starting material for formation of a deposited film via a first gas transportation conduit into the evacuated film-forming space wherein the gaseous starting material is capable of being a constituent for a film, but essentially incapable of contributing to film formation when the gaseous starting material is in an original state;

(c) introducing a gaseous halogenic oxidizing agent via a second gas transportation conduit, wherein the first and second gas transportation conduits are concentric and terminate adjacent to the substrate forming a reaction space, the gaseous halogenic oxidizing agent having an oxidizing property on the gaseous starting material in the reaction space to effect chemical contact therebetween and to thereby cause a chemical reaction in the absence of a plasma in the reaction space, to generate a plurality of precursors containing excited precursors, wherein at least one of the precursors form the film constituting at least one of the first, second and third layers; and (d) maintaining the distance between the outlet of the first and second concentric gas transportation conduits and the surface of the substrate from 5 millimeters to 15 centimeters.

2. The process according to claim 1 wherein the gaseous starting material contains a chain silane compound.

3. The process according to claim 2 wherein the chain silane compound is a straight chain silane compound.

4. The process according to claim 3 wherein the straight chain silane compound is a compound represented by the formula: $Si_nH_{2n+2}$, where n is a integer from 1 to 8.

5. The process according to claim 2 wherein the chain silane compound is a branched chain silane compound.

6. The process according to claim 1 wherein the gaseous starting material contains a cyclic silane compound.

7. The process according to claim 1 wherein the halogen gas is selected from the group consisting of $F_2$ gas, $Cl_2$ gas $Br_2$ gas, $I_2$ gas, nascent state fluorine, nascent state chlorine and nascent state iodine.

8. The process according to claim 1 wherein the chemical reaction of the starting material and the gaseous halogenic oxidizing agent and the formation of the film occur with an emission of energy.

9. The process according to claim 1 wherein the first and second gas transportation conduits are integrated in a concentric triple conduit having ends facing the surface of the substrate.

10. The process according to claim 1 wherein the first and second gas transportation conduits are integrated in a concentric triple conduit having ends facing the substrate, wherein the middle end is positioned in the innermost recess encircled by two other ends so as to form a circular space or a conic trapezoidal space.

* * * * *